United States Patent
Matsumoto et al.

(10) Patent No.: US 10,276,544 B2
(45) Date of Patent: Apr. 30, 2019

(54) SEMICONDUCTOR PACKAGE

(71) Applicant: TOSHIBA MEMORY CORPORATION, Minato-ku, Tokyo (JP)

(72) Inventors: Manabu Matsumoto, Yokohama Kanagawa (JP); Katsuya Murakami, Sumida Tokyo (JP); Akira Tanimoto, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/910,725

(22) Filed: Mar. 2, 2018

(65) Prior Publication Data

US 2019/0088623 A1 Mar. 21, 2019

(30) Foreign Application Priority Data

Sep. 19, 2017 (JP) ................................ 2017-178638

(51) Int. Cl.
| | |
|---|---|
| H01L 23/02 | (2006.01) |
| H01L 25/065 | (2006.01) |
| H01L 23/31 | (2006.01) |
| H01L 23/48 | (2006.01) |
| H01L 25/16 | (2006.01) |
| H01L 21/66 | (2006.01) |
| H01L 23/367 | (2006.01) |

(52) U.S. Cl.
CPC .......... *H01L 25/0657* (2013.01); *H01L 22/32* (2013.01); *H01L 23/3128* (2013.01); *H01L 23/367* (2013.01); *H01L 23/481* (2013.01); *H01L 25/16* (2013.01); *H01L 2225/0652* (2013.01); *H01L 2225/06517* (2013.01); *H01L 2225/06541* (2013.01)

(58) Field of Classification Search
None
See application file for complete search history.

(56) References Cited

U.S. PATENT DOCUMENTS

| | | | |
|---|---|---|---|
| 9,792,983 B2 | 10/2017 | Hirashima et al. | |
| 2011/0272692 A1* | 11/2011 | Han | H01L 23/367 |
| | | | 257/48 |
| 2012/0187401 A1* | 7/2012 | Waki | H01L 21/565 |
| | | | 257/48 |
| 2012/0248600 A1* | 10/2012 | Shigezane | H01L 23/481 |
| | | | 257/737 |

(Continued)

*Primary Examiner* — Kevin M Picardat
(74) *Attorney, Agent, or Firm* — Foley & Lardner LLP

(57) ABSTRACT

A semiconductor package includes a board, a plurality of semiconductor memory chips, a controller chip, and a sealing resin portion. The plurality of semiconductor memory chips are stacked in a thickness direction of the board. The controller chip is disposed between the board and the plurality of semiconductor memory chips or on a side of the plurality of semiconductor chips opposite to the board. The sealing resin portion seals the plurality of semiconductor memory chips and the controller chip. The plurality of semiconductor memory chips include at least one through via that penetrates one or more semiconductor memory chips of the plurality of semiconductor memory chips in the thickness direction of the board to be connected to the controller chip.

13 Claims, 13 Drawing Sheets

(56) References Cited

U.S. PATENT DOCUMENTS

| | | | |
|---|---|---|---|
| 2012/0314511 A1* | 12/2012 | Ishikawa | G01R 31/2884 365/189.05 |
| 2013/0320560 A1* | 12/2013 | Secker | H01L 23/481 257/774 |
| 2014/0070422 A1* | 3/2014 | Hsiao | H01L 24/24 257/774 |
| 2015/0270250 A1* | 9/2015 | Takamitsu | H01L 23/481 257/48 |
| 2016/0357630 A1* | 12/2016 | Kang | G11O 5/025 |

* cited by examiner

SEMICONDUCTOR PACKAGE

CROSS-REFERENCE TO RELATED APPLICATION

This application claims the benefit of and priority to Japanese Patent Application No. 2017-178638, filed Sep. 19, 2017, the entire contents of which are incorporated herein by reference.

FIELD

Embodiments described herein relate generally to a semiconductor package.

BACKGROUND

Some memory packages include a plurality of semiconductor memory chips electrically connected to each other by through-silicon vias (TSVs).

Some semiconductor packages are configured such that a plurality of semiconductor memory chips and a controller chip for controlling the plurality of semiconductor memory chips are mounted in a single package. Such a semiconductor package may benefit from being made small.

DETAILED DESCRIPTION

Figure 1:
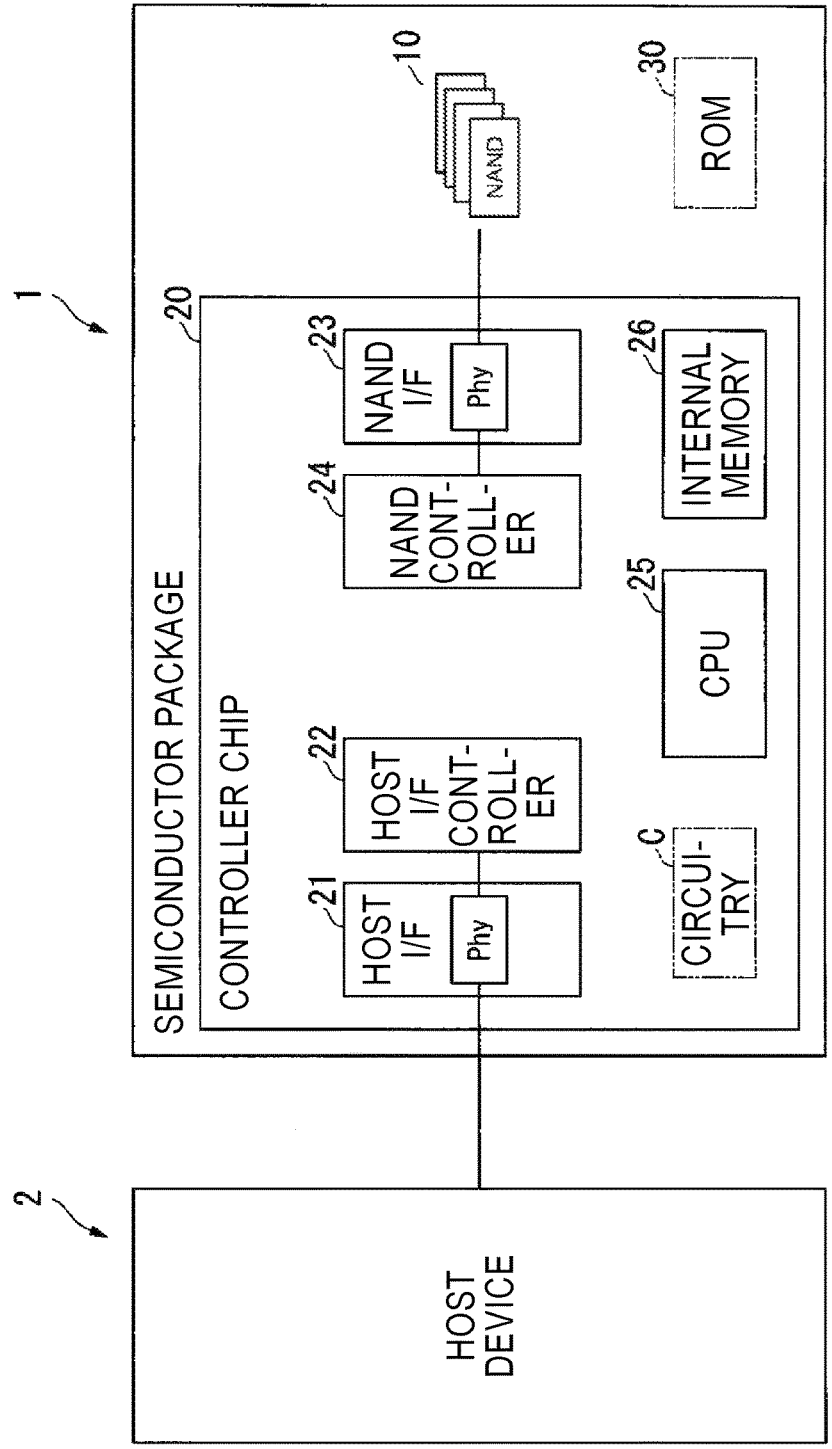
FIG. 1 is a block diagram illustrating components of one or more embodiments of a semiconductor package according to a first aspect.

Exemplary embodiments provide for a small semiconductor package.

In general, according to one or more embodiments, a semiconductor package includes a board (e.g. a package board, described in more detail below), a plurality of semiconductor memory chips, a controller chip, and a sealing resin portion. The plurality of semiconductor memory chips are stacked in a thickness direction of the board. The controller chip is disposed between the board and the plurality of semiconductor memory chips or on a side opposite to the plurality of semiconductor memory chips opposite to the board. The sealing resin portion seals the plurality of semiconductor memory chips and the controller chip. The plurality of semiconductor memory chips include at least one through via that penetrates one or more semiconductor memory chips provided in the plurality of semiconductor memory chips in the thickness direction of the board to be connected to the controller chip.

Hereinafter, embodiments of semiconductor packages according to various aspects will be described with reference to the drawings. In the descriptions below, components having the same or similar function will be denoted by a common reference numeral. In addition, redundant descriptions of the components may be omitted.

Here, first, directions +X, −X, +Y, −Y, +Z, and −Z will be defined. The directions +X, −X, +Y, and −Y are substantially in parallel with, for example, a first surface 40a of a package board 40 of a semiconductor package 1. The direction −X is opposite to the direction +X. When the directions +X and −X are not specified, the directions will be simply referred to as the "direction X." The directions +Y and −Y cross (e.g., substantially orthogonally) the direction X. The direction −Y is opposite to the direction +Y. When the directions +Y and −Y are not specified, the directions will be simply referred to as the "direction Y." The directions +Z and −Z cross (e.g., substantially orthogonally) the directions X and Y. The directions +Z and −Z are the thickness direction of the package board 40. When the directions +Z and −Z are not specified, the directions will be simply referred to as the "direction Z."

<First Aspect>

One or more embodiments of a semiconductor package 1 according to a first aspect will be described with reference to FIGS. 1 to 3. The semiconductor package 1 according to the present aspect is a solid state drive (SSD) in which a plurality of NAND chips 10 and a controller chip 20 for controlling the plurality of NAND chips 10 are mounted in one package, and is a so-called single package SSD. The semiconductor package 1 may be referred to as a "storage device," a "semiconductor storage device" or the like.

FIG. 1 is a block diagram illustrating components of the semiconductor package 1. The semiconductor package 1 is electrically connected to a host device 2 and functions as a storing area of the host device 2. The host device 2 is, for example, an information processing device to be equipped with a circuit board B (see FIG. 2) in which the semiconductor package 1 is mounted.

As illustrated in FIG. 1, the semiconductor package 1 includes the plurality of NAND chips 10 (although FIG. 1 illustrates only one NAND chip 10 for the sake of clarity) and a controller chip 20.

Each of the plurality of NAND chips 10 is a nonvolatile memory chip, for example, a NAND type flash memory chip. The NAND chip 10 is an example of a "semiconductor memory chip." However, the term "semiconductor memory chip" is not limited to the NAND chip 10, and may refer to a magnetoresistive random access memory (MRAM) or another type of a memory chip.

The controller chip 20 collectively controls the plurality of NAND chips 10. The controller chip 20 communicates with one or more NAND chips 10 based on a command (e.g., a read command, a write command, or an erase command) from the host device 2, to execute a process requested by the command with respect to the one or more NAND chips 10. Further, the controller chip 20 manages, for example, an address translation table for data to be written in the NAND chips 10 and a degree of exhaustion of the NAND chips 10. The address translation table is a table in which a logical address of a write destination of data and a physical address to which data is written are associated with each other. The degree of exhaustion of a NAND chip 10 is determined by referring to, for example, the number of times of data writing, reading, or erasing in blocks (e.g., logical blocks) included in the NAND chip 10.

The controller chip 20 is configured with a system on a chip (SoC). The controller chip 20 includes, for example, a host interface 21, a host interface controller 22, a NAND interface 23, a NAND controller 24, a central processing unit (CPU) 25, and an internal memory 26.

The host interface 21 has a physical layer Phy that is electrically connected to the host device 2. The host interface 21 is configured with, for example, a PCI express (PCIe), a serial advanced technology attachment (SATA), a serial attached small computer system interface (SCSI) (SAS), or a non-volatile memory host controller interface (NVM express) (NVMe). The host interface controller 22 controls the host interface 21 so as to transmit and receive signals between the host device 2 and the controller chip 20.

The NAND interface 23 has a physical layer Phy electrically connected to the NAND chips 10. The NAND controller 24 controls the NAND interface 23 so as to transmit and receive signals between the NAND chips 10 and the controller chip 20.

The CPU 25 is a hardware processor that controls the controller chip 20 (e.g. the entire semiconductor package 1) by executing programs (e.g., firmware) stored in the internal memory 26 of the controller chip 20, a ROM 30 provided outside the controller chip 20 or the like. The CPU 25 is an example of a "processor." For example, the CPU 25 controls writing, reading, and erasing of data with respect to the plurality of NAND chips 10 based on a command from the host device 2. The controller chip 20 may have a circuitry C that controls the controller chip 20 (e.g. the entire semiconductor package 1), instead of the CPU 25. The circuitry C may be implemented with hardware such as large scale integration (LSI), an application specific integrated circuit (ASIC), or a field-programmable gate array (FPGA).

The internal memory 26 is a storing area provided inside the controller chip 20. The internal memory 26 is implemented with, for example, a static random access memory (SRAM), and may be implemented with another type of a memory chip.

Figure 2:
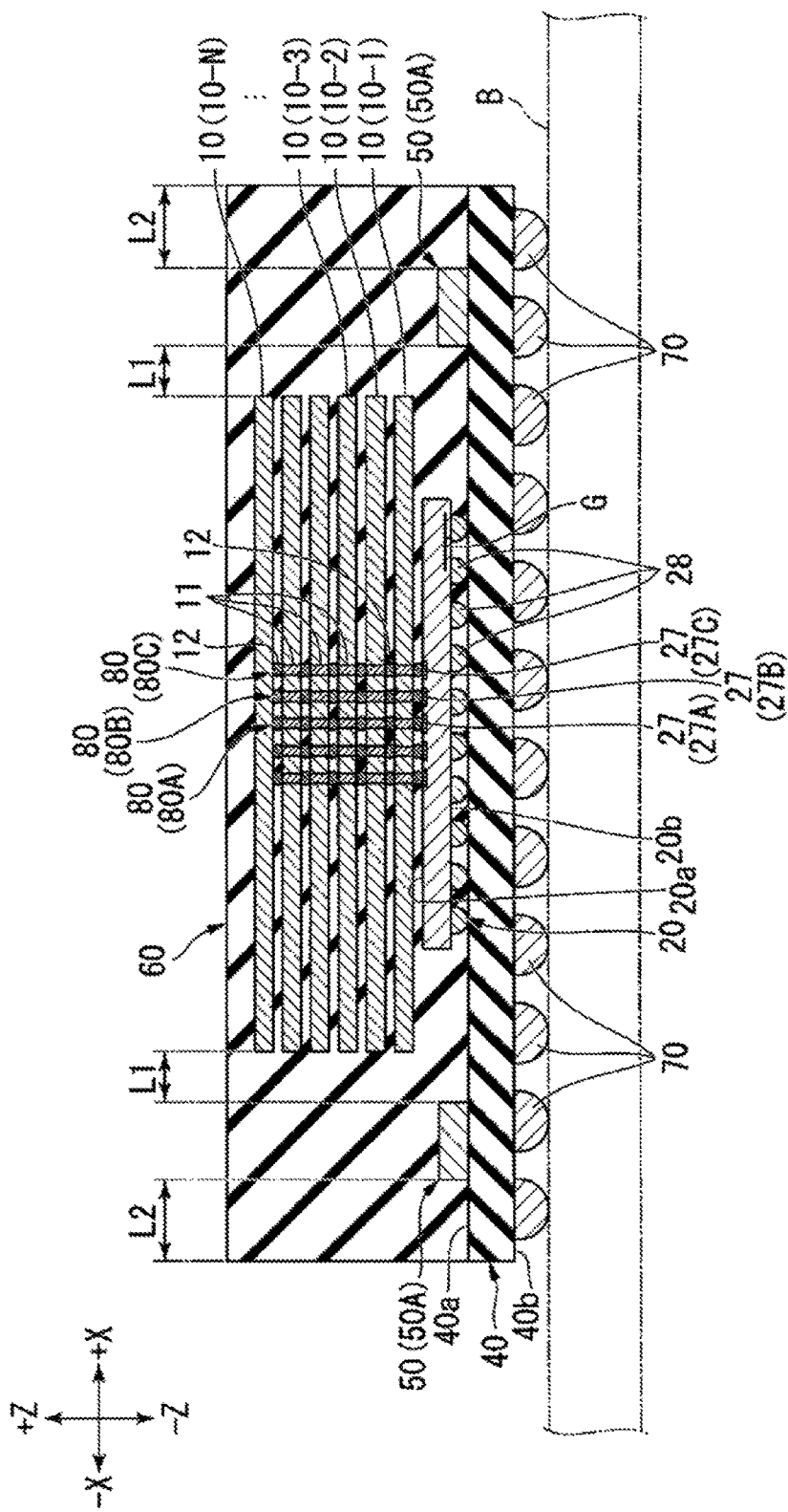
FIG. 2 is a cross-sectional view illustrating the one or more embodiments of the semiconductor package according to the first aspect.

FIG. 2 is a cross-sectional view illustrating the semiconductor package 1. In addition to the above-described components, the semiconductor package 1 includes a package board 40, a plurality of electronic components 50, a sealing resin portion 60, and a plurality of electrodes 70.

The package board 40 is an example of a "board." The plurality of NAND chips 10 and the controller chip 20 are mounted on the package board 40. The package board 40 has a first surface 40a and a second surface 40b. The first surface 40a faces the plurality of NAND chips 10 and the controller chip 20. The second surface 40b is located at the opposite side to the first surface 40a. The second surface 40b faces the circuit board B in which the semiconductor package 1 is mounted.

The plurality of NAND chips 10 are stacked in the direction Z. The description "stacked" in the present disclosure includes a case where gaps corresponding to connection electrodes 12 exist in the direction Z among the plurality of NAND chips 10. In the present aspect, the plurality of NAND chips 10 overlap with the controller chip 20 in the direction Z. The plurality of NAND chips 10 are stacked on the controller chip 20.

In the present aspect, the plurality of NAND chips 10 include a NAND chip 10-1, a NAND chip 10-2, . . . , and a NAND chip 10-N(N is an arbitrary natural number). The NAND chip 10-1, the NAND chip 10-2, . . . , and the NAND chip 10-N are stacked apart in this order from the package board 40. Among the plurality of NAND chips 10, the NAND chip 10-N is farthest from the package board 40. Each of the plurality of NAND chips 10 is an example of a "first semiconductor memory chip."

The controller chip 20 is disposed between the package board 40 and the plurality of NAND chips 10. The controller chip 20 has a first surface 20a and a second surface 20b. The first surface 20a faces the NAND chip 10-1. The second surface 20b is located at the opposite side to the first surface 20a. The second surface 20b faces the package board 40. Further, the controller chip 20 includes a plurality of terminals 27 and a plurality of bumps 28.

The plurality of terminals 27 are provided on the first face 20a of the controller chip 20. The plurality of terminals 27 are disposed in, for example, an array form to be arranged side by side in each of the directions X and Y. The description "disposed in an array form" indicates being dispersed and arranged in each of, for example, a first direction and a second direction crossing the first direction. The plurality of terminals 27 include a signal terminal 27A electrically connected to a signal line of the controller chip 20, a ground terminal 27B electrically connected to the ground G of the controller chip 20, and a power supply terminal 27C to which a power is supplied from the package board 40 via the controller chip 20. The plurality of terminals 27 are physically and electrically connected to through vias 80, respectively, to be described later.

Meanwhile, the plurality of bumps 28 are provided on the second surface 20b of the controller chip 20. The plurality of bumps 28 are disposed in an array form to be arranged side by side in each of the directions X and Y. The plurality of bumps 28 are bonded to a plurality of pads (not illustrated) provided on the first surface 40a of the package board 40. The controller chip 20 is flip-chip connected to the first surface 40a of the package board 40. In the present aspect, the controller chip 20 is electrically connected to the package board 40 by the plurality of bumps 28.

The plurality of electronic components 50 are mounted on the first surface 40a of the package board 40. The plurality of electronic components 50 are electrically connected to the controller chip 20 via the package board 40. The plurality of electronic components 50 include any of, for example, a capacitor 51, a resistor 52, and a load switch 53 (e.g. as shown in FIG. 3). The capacitor 51 and the resistor 52 are an example of "passive components."

The sealing resin portion 60 is formed of an insulating synthetic resin. The sealing resin portion 60 seals the plurality of NAND chips 10, the controller chip 20, and the plurality of electronic components 50 in an integrated manner.

The plurality of electrodes 70 are provided on the second surface 40b of the package board 40. The plurality of electrodes 70 form external connection terminals of the semiconductor package 1. The plurality of electrodes 70 are bonded to a plurality of pads (not illustrated) provided on the circuit board B.

Next, an electrical connection structure between the plurality of NAND chips 10 and the controller chip 20 will be described. In the present aspect, the plurality of NAND chips 10 include a plurality of through vias 80. As used herein, reference to one or more components "including" one or more through vias can refer to the one or more components including, or defining, a portion of the one or more through vias or the entirety of the one or more through vias. Each through via 80 includes through vias 11 provided in the plurality of NAND chips 10, respectively, and connection electrodes 12 respectively provided among (e.g. between) the plurality of NAND chips 10.

Each through via 11 is, for example, a conductor penetrating a NAND chip 10 in the direction Z. For example, the through via 11 is a through silicon via (TSV). The through via 11 need not penetrate a NAND chip 10 with a constant thickness as long as the through via 11 electrically interconnects the connection electrodes 12 disposed on the upper and lower portions of the NAND chip 10.

Each connection electrode 12 is sandwiched between the through vias 11 of the plurality of NAND chips 10 and electrically interconnects the through vias 11 of the plurality of NAND chips 10. The connection electrode 12 is, for example, a micro-bump formed on the surface of a NAND chip 10. However, the connection electrode 12 may have any other configuration as long as the connection electrode 12 may electrically interconnect the through vias 11 of the plurality of NAND chips 10. A size, shape, material and others of the connection electrode 12 are not specifically limited.

The through vias 80 are formed in the manner that the plurality of NAND chips 10 having the connection electrodes 12, respectively, are stacked in the direction Z, and the through vias 11 and the connection electrodes 12 are alternately connected to each other in the direction Z. Thus, each through via 80 is formed in a columnar shape penetrating the plurality of NAND chips 10 in the direction Z. The plurality of through vias 80 are provided in the region overlapping with the controller chip 20 in the direction Z. The through vias 80 penetrate the plurality of NAND chips 10 in the direction Z to be physically and electrically connected to the terminals 27 of the controller chip 20. In addition, the through vias 80 may or may not penetrate the uppermost NAND chip 10-N. In the present aspect, the plurality of through vias 80 are uniformly formed on the controller chip 20. The through vias 80 connected to the controller chip 20 may be thicker than the through vias interconnecting only the NAND chips 10 (e.g. thicker by a ratio of about 1.1 or more, about 1.2 or more, or about 1.3 or more). A communication between the controller chip 20 and the NAND chips 10 is conducted at a relatively high speed, and can lower a resistance value of the through vias 80. Meanwhile, the thickness of each through via 80 is not limited to the example described above.

The plurality of through vias 80 include through vias 80A, 80B, and 80C. The through via 80A is connected to the signal terminal 27A of the controller chip 20. For example, the through via 80A is electrically connected to the NAND interface 23 of the controller chip 20 via the signal terminal 27A of the controller chip 20. Further, the through via 80A is electrically connected to a signal line provided in at least one NAND chip 10 (e.g. via the signal terminal 27A). The controller chip 20 communicates with (e.g. is electrically connected to) the NAND chip 10 (that is, transmits and receives signals) via the through via 80A. The controller chip 20 executes writing, reading, and erasing of data with respect to the NAND chip 10 via the through via 80A. The through via 80A is an example of a "first through via."

The through via 80B is electrically connected to the ground G of the controller chip 20 via the ground terminal 27B of the controller chip 20. The through via 80B electrically interconnects the ground of the NAND chips 10 and the ground G of the controller chip 20. The through via 80C is connected to the power supply terminal 27C of the controller chip 20. The controller chip 20 supplies a power to the NAND chips 10 via the through via 80C.

Figure 3:
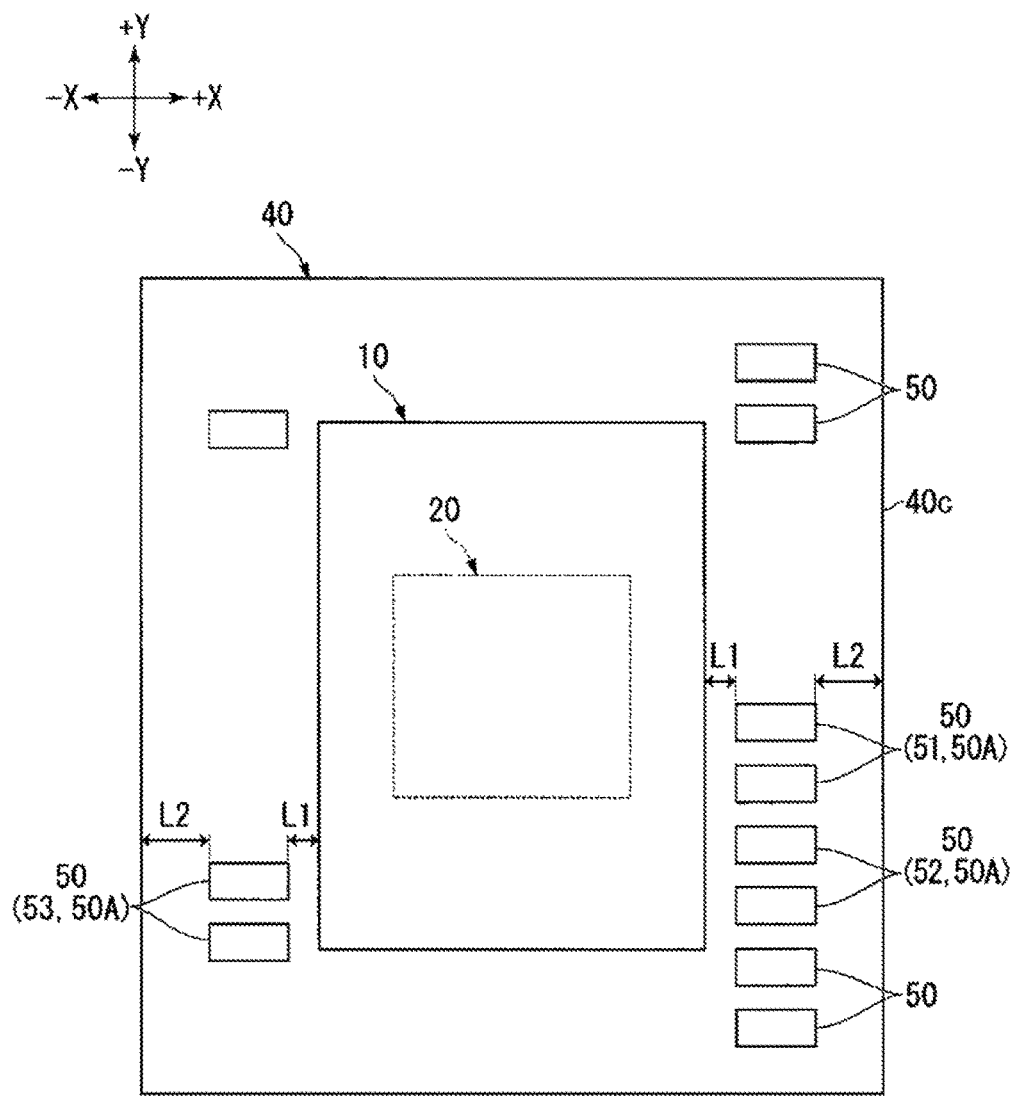
FIG. 3 is a plan view illustrating the components of the one or more embodiments of semiconductor package according to the first aspect.

FIG. 3 is a plan view illustrating the components of the semiconductor package 1. FIG. 3 omits the illustration of the sealing resin portion 60. The plurality of electronic components 50 are disposed near the NAND chips 10. For example, the plurality of electronic components 50 include several electronic components 50A. As illustrated in FIG. 3, in the direction X, the shortest distance L1 between an electronic component 50A and at least one NAND chip 10 of the plurality of NAND chips 10 is shorter than the shortest distance L2 between the electronic component 50A and the edge 40c of the package board 40. The shortest distance L2 between the electronic component 50A and the edge 40c of the package board 40 indicates the shortest distance between the electronic component 50A and a portion of the edge 40c of the package board 40 which is closest to the electronic component 50A. However, the position of the electronic component 50A is not limited to the example described above.

According to the configuration described above, the semiconductor package 1 can be made small. That is, in implementations in which the NAND chips and the controller chip are electrically interconnected via bonding wires and the package board, a region for connection of the bonding wires may be provided for in the semiconductor package. When the region for connection of the bonding wires is provided for in the semiconductor package, it may be difficult make the semiconductor package small. In addition, when the NAND chips and the controller chip are connected to the package board by bonding wires, noise can be readily received.

Meanwhile, the semiconductor package 1 of the present aspect includes the package board 40, the plurality of NAND chips 10 stacked in the thickness direction of the package board 40, and the controller chip 20 disposed between the package board 40 and the plurality of NAND chips 10. The plurality of NAND chips 10 have at least one through via 80 that penetrates one or more NAND chips 10 in the direction Z to be connected to the controller chip 20. According to this configuration, bonding wires for electrically interconnecting the NAND chips 10 and the controller chip 20 may be omitted, or the number of the bonding wires can be reduced. Thus, the region for connection of the bonding wires in the semiconductor package 1 can be eliminated or reduced. As a result, the semiconductor package 1 can be made small. In addition, when the through vias 80 are provided, instead of the bonding wires, an electrical loss occurring in the bonding wires can be reduced. Thus, the power consumption of the semiconductor package 1 can be reduced.

In the present aspect, the plurality of through vias 80 include the through via 80A electrically connected to the signal line of the NAND chips 10. The controller chip 20 communicates with (e.g. is electrically connected to) the NAND chips 10 via the through via 80A. According to this configuration, the communication distance (electrical connection distance) between the NAND chips 10 and the controller chip 20 can be reduced, as compared with a case where the NAND chips 10 and the controller chip 20 are electrically interconnected via the bonding wires and the package board 40. Thus, the quality of the signal between the NAND chips 10 and the controller chip 20 can be improved. As a result, it is possible to provide the semiconductor package 1 having a relatively high performance.

In the present aspect, the semiconductor package 1 is mounted on the package board 40 and equipped with the electronic components 50 electrically connected to the controller chip 20. In the direction X, the shortest distance L1 between the electronic components 50 and the NAND chips 10 is shorter than the shortest distance L2 between the electronic components 50 and the edge 40c of the package board 40. In other words, in the semiconductor package 1 of the present aspect, the electronic components 50 can be disposed without providing for a region for connection of the bonding wires. Thus, the electronic components 50 can be disposed near the NAND chips 10 and the controller chip 20. According to this configuration, the semiconductor package 1 can be made small even when the electronic components 50 are mounted on the package board 40. In addition, when passive components such as a capacitor are mounted as the electronic components 50, noise can be eliminated or reduced, and thus, the signal quality can be improved.

(Second Aspect)

Next, one or more embodiments of a semiconductor package 1 according to a second aspect will be described. The present aspect is different from the first aspect in that in the present aspect, improvement of heat radiation is further implemented by the through vias 80. Other than the configurations described below, configurations of the second aspect are substantially identical to those of the first aspect.

Figure 4:
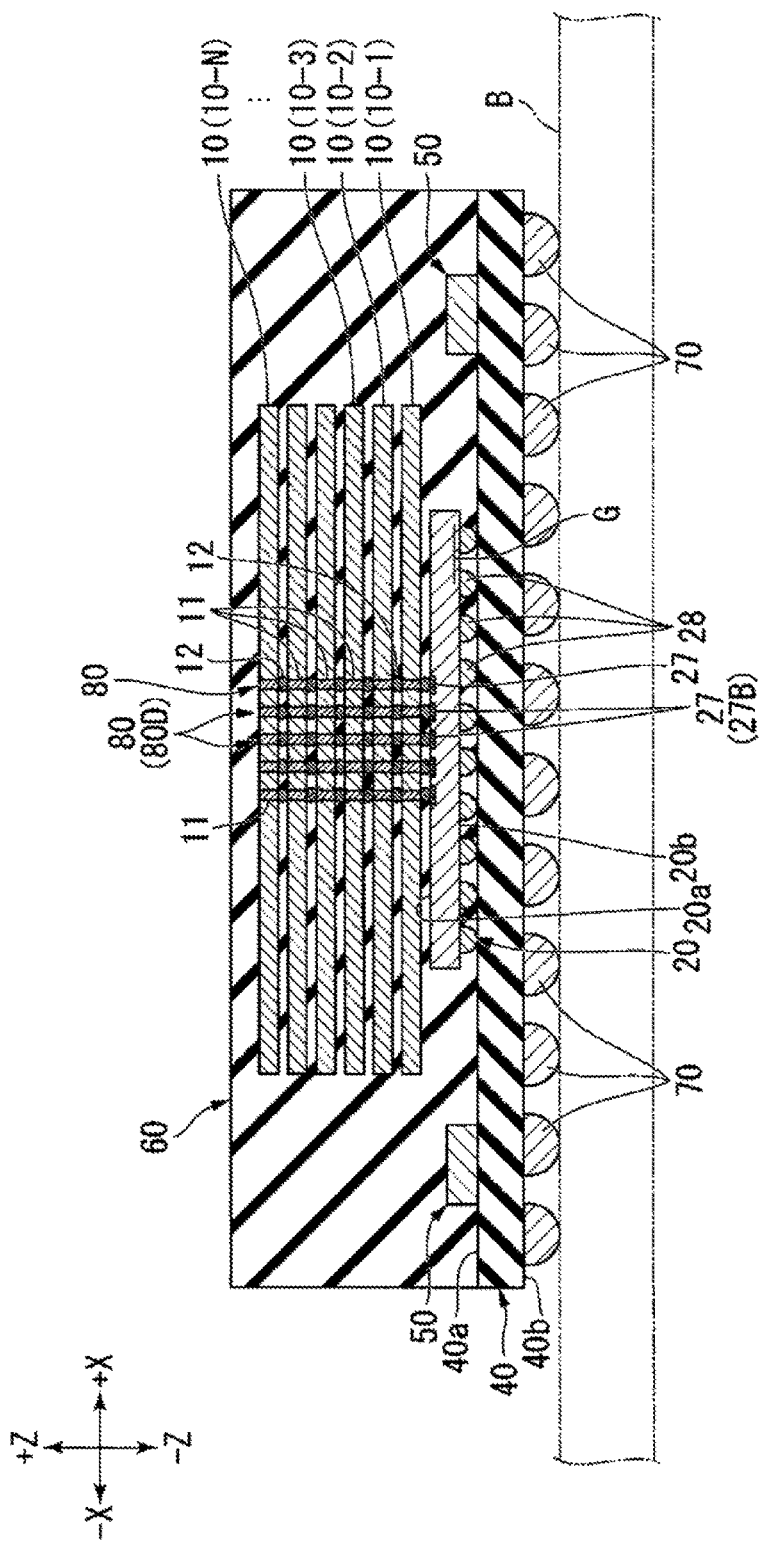
FIG. 4 is a cross-sectional view illustrating one or more embodiments of a semiconductor package according to a second aspect.

FIG. 4 is a cross-sectional view illustrating one or more embodiments of the semiconductor package 1 according to the present aspect. In the present aspect, for example, the plurality of through vias 80 penetrate a top NAND chip 10 and a bottom NAND chip 10 in the Z direction (e.g. penetrate all the NAND chips 10 in the direction Z). The plurality of through vias 80 penetrate the uppermost NAND chip 10-N as well (according to the first aspect, such penetration may be omitted). In the present aspect, the plurality of through vias 80 include a plurality of through vias 80D provided for heat radiation. The plurality of through vias 80D are not connected to the signal line of the controller chip 20. The plurality of through vias D are connected to, for example, the ground G of the controller chip 20. Each through via D for the heat radiation may be thicker than a through via A for signal delivery (e.g. may be thicker by a ratio of about 1.1 or more, about 1.2 or more, or about 1.3 or more).

Figure 5:
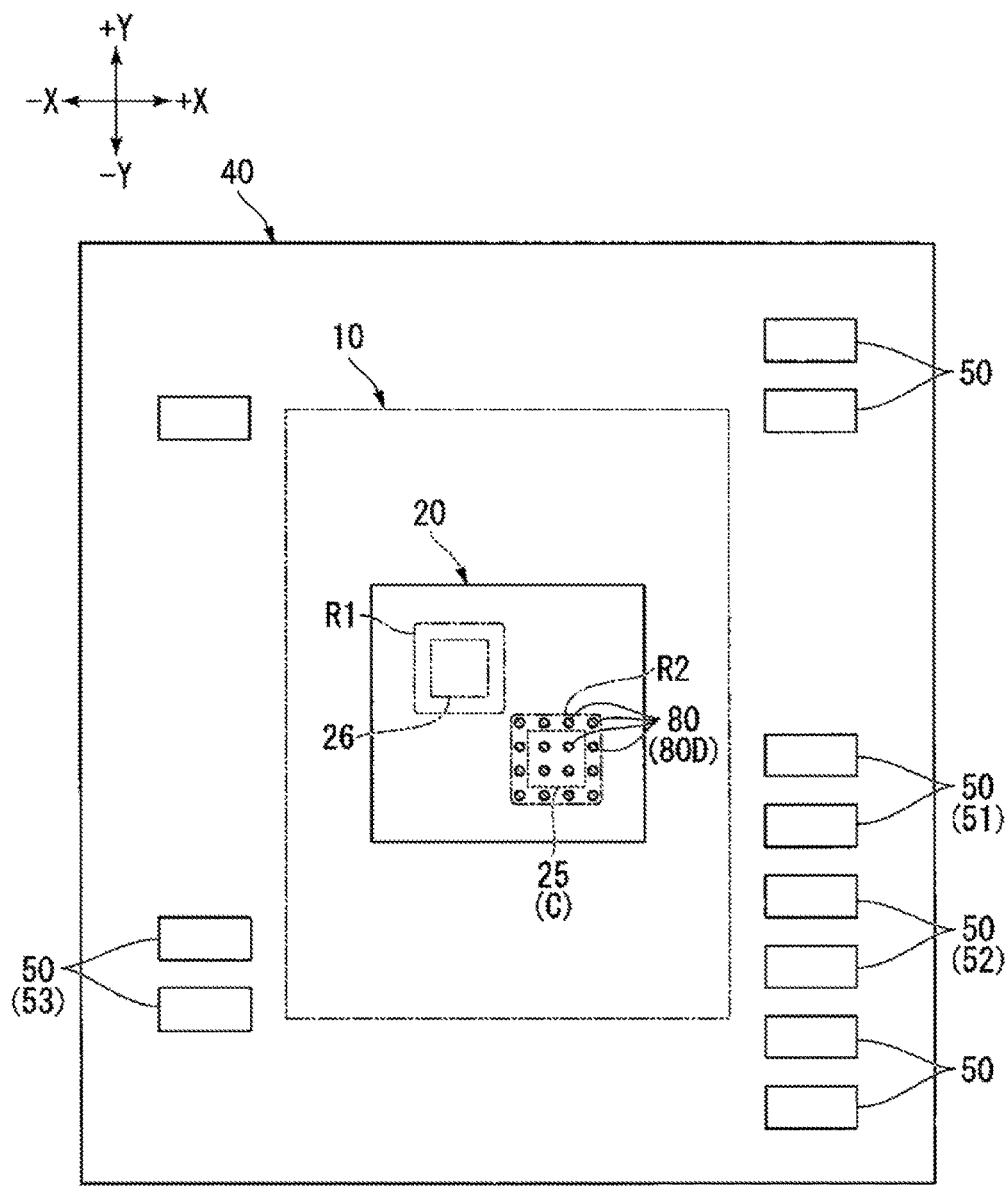
FIG. 5 is a plan view illustrating components of the one or more embodiments of the semiconductor package according to the second aspect.

FIG. 5 is a plan view illustrating components of one or more embodiments of the semiconductor package 1 according to the present aspect. FIG. 5 omits the illustration of the sealing resin portion 60. In the present aspect, the controller chip 20 has a first region R1 and a second region R2. The second region R2 generates a larger amount of heat per unit area than does the first region R1.

For example, the first region R1 is a region on the surface of the controller chip 20 which overlaps with the internal memory 26 in the direction Z. The first region R1 may be a region overlapping with the NAND interface 23, rather than the example described above. Meanwhile, the second region R2 is a region on the surface of the controller chip 20 which overlaps with the CPU 25 in the direction Z. The CPU 25 generates heat (e.g. more heat than the internal memory 26 or the NAND interface 23), in a state where the semiconductor package 1 is being operated. Thus, the second region R2 is readily heated, as compared with the first region R1.

In another example, the second region R2 is a region on the surface of the controller chip 20 which overlaps with the circuitry C in the direction Z. The circuitry C generates heat, as compared with the internal memory 26 or the NAND interface 23, in a state where the semiconductor package 1 is being operated. Thus, the second region R2 is readily heated, as compared with the first region R1.

In the present aspect, the plurality of through vias 80 (e.g., the plurality of through vias 80D) are connected to the second region R2 of the controller chip 20. The plurality of through vias 80 function as heat radiation paths for the second region R2 of the controller chip 20. For example, the plurality of through vias 80 deliver the heat of the second region R2 of the controller chip 20 to a region apart from the controller chip 20 in the semiconductor package 1. As a result, the heat radiation of the controller chip 20 is promoted. Each through via 80 connected to the second region R2 is an example of a "second through via."

According to this configuration, as in the first aspect, the semiconductor package 1 can be made small. In addition, in the present aspect, the controller chip 20 has the first region R1 and the second region R2 having a larger amount of heat generated per unit area than that in the first region R1. At least one through via 80 is connected to the second region R2 of the controller chip 20. According to this configuration, the heat of the controller chip 20 can be effectively moved to the outside of the controller chip 20 by the through vias 80 connected to the second region R2. Thus, the heat radiation of the semiconductor package 1 can be improved.

(First Modification of Second Aspect)

Figure 6:
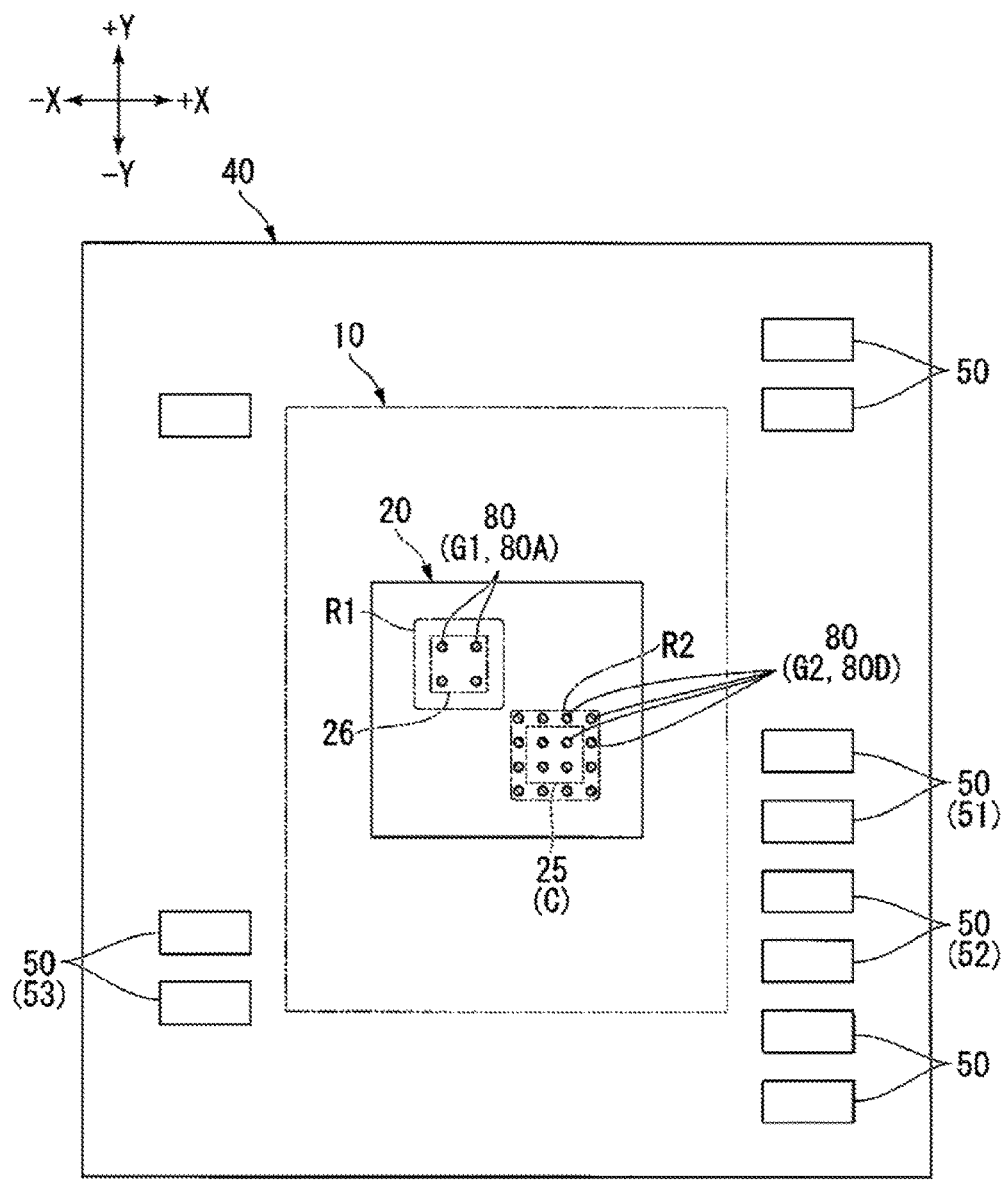
FIG. 6 is a plan view illustrating components of one or more embodiments of a semiconductor package according to a first modification of the second aspect.

FIG. 6 is a plan view illustrating components of a semiconductor package 1 according to a first modification of the second aspect. FIG. 6 omits the illustration of the sealing resin portion 60. In addition, configurations other than the configurations described below are substantially identical to those of the second aspect.

In the present modification, the plurality of through vias 80 include a plurality of through vias 80 in a first group G1 and a plurality of through vias 80 in a second group G2. The plurality of through vias 80 in the first group G1 are connected to the first region R1. For example, the plurality of through vias 80 in the first group G1 are through vias 80A electrically connected to the signal line of the controller chip 20. However, the type of the plurality of through vias 80 in the first group G1 is not limited to the example described above. Meanwhile, the plurality of through vias 80 in the second group G2 are connected to the second region R2. The plurality of through vias 80 in the second group G2 are, for example, heat radiation through vias 80D electrically connected to the ground G of the controller chip 20. However, the type of the plurality of through vias 80 in the second group G2 is not limited to the example described above. Here, an arrangement density of the plurality of through vias 80 in the second group G2 is higher than an arrangement density of the plurality of through vias 80 in the first group G1 (e.g. higher by a factor of about 1.1 or more, about 1.2 or more, or about 1.3 or more). The term "arrangement density" refers to a number of the through vias 80 provided in a unit area on the plane along the directions X and Y.

According to this configuration, the heat of the second region R2 of the controller chip 20 can be effectively moved to a region apart from the controller chip 20 by the plurality of through vias 80 in the second group G2 which are arranged with a higher density than that in the first region R1. As a result, the heat radiation of the semiconductor package 1 can be further improved.

(Second Modification of Second Aspect)

Figure 7:
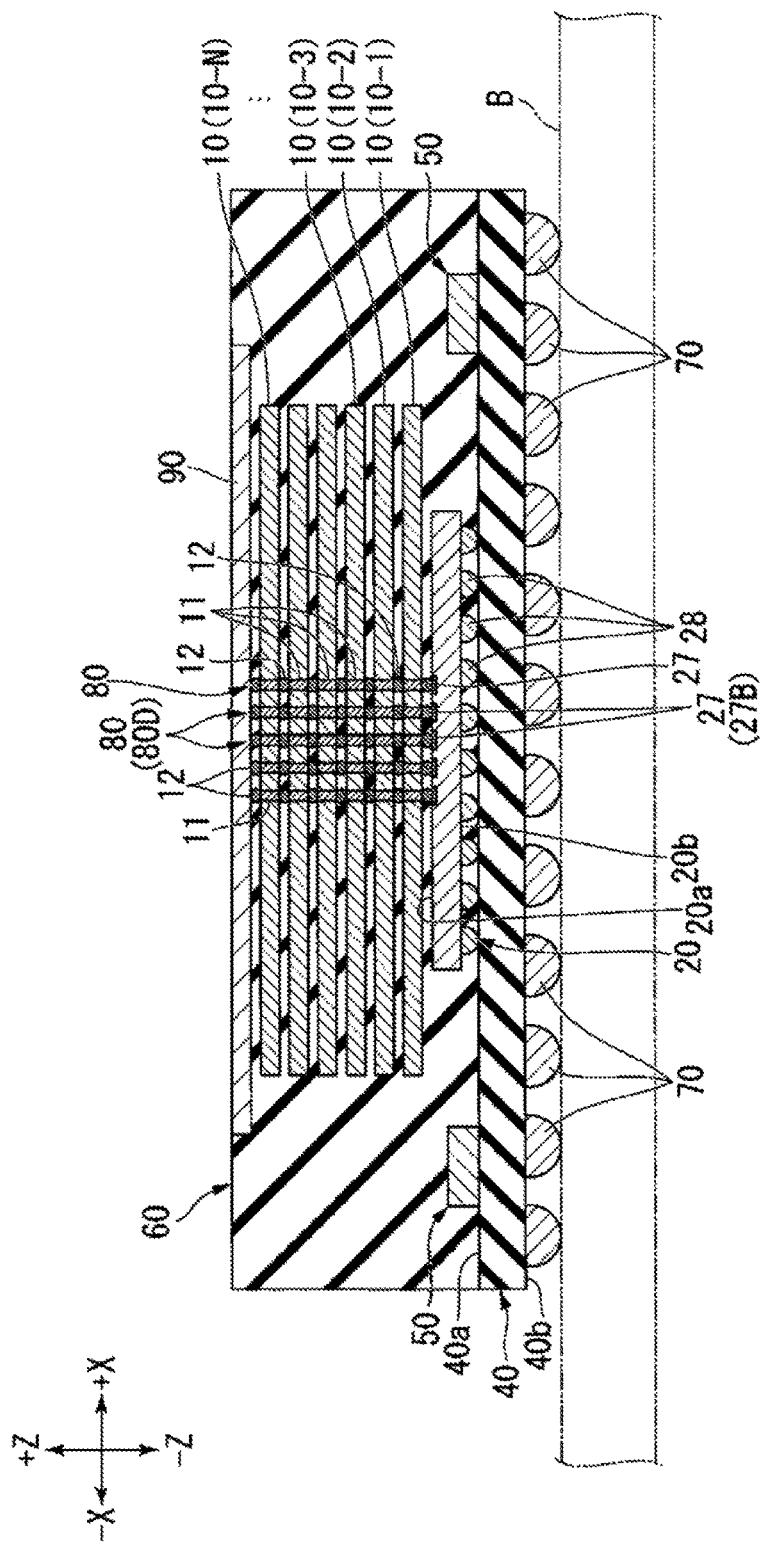
FIG. 7 is a cross-sectional view illustrating one or more embodiments of a semiconductor package according to one or more embodiments of a second modification of the second aspect.

FIG. 7 is a plan view illustrating one or more embodiments of a semiconductor package 1 according to a second modification of the second aspect. In addition, configurations other than the configurations described below are substantially identical to those in the second aspect.

In the present modification, the semiconductor package 1 includes a heat radiation plate 90 made of a metal. For example, the heat radiation plate 90 is formed in a flat plate shape along the directions X and Y. The heat radiation plate 90 is disposed on the side opposite to the controller chip 20 with respect to the plurality of NAND chips 10. The heat radiation plate 90 is exposed to the outside of the sealing resin portion 60. The plurality of through vias 80 are connected to the controller chip 20. For example, the plurality of through vias 80 include heat radiation through vias 80D. The plurality of through vias 80 penetrate the plurality of NAND chips 10 to be connected to the heat radiation plate 90.

Specifically, each through via 80 includes a connection electrode 12 (which can function as a conductor) provided between the heat radiation plate 90 and the uppermost NAND chip 10-N. The connection electrode 12 provided between the heat radiation plate 90 and the uppermost NAND chip 10-N may be identical or different in shape, size, and material to or from a connection electrode 12 provided between the plurality of NAND chips 10. The connection electrode 12 is sandwiched between the heat radiation plate 90 and the through via 11 of the NAND chip 10-N to thermally interconnect the heat radiation plate 90 and the through via 11 of the NAND chip 10-N. Thus, the controller chip 20 is thermally connected to the heat radiation plate 90 via the through vias 80.

According to this configuration, the heat of the controller chip 20 can be effectively moved to the heat radiation plate 90 by the through vias 80. As a result, the heat radiation of the semiconductor package 1 can be further improved.

(Third Aspect)

Next, one or more embodiments of a semiconductor package 1 according to a third aspect will be described. The present aspect is different from the first aspect in that in the present aspect, test pads 100 provided in the sealing resin portion 60 and test terminals 29 of the controller chip 20 are connected to each other by the through vias 80. Meanwhile, configurations other than the configurations described below are substantially identical to those of the first aspect.

Figure 8:
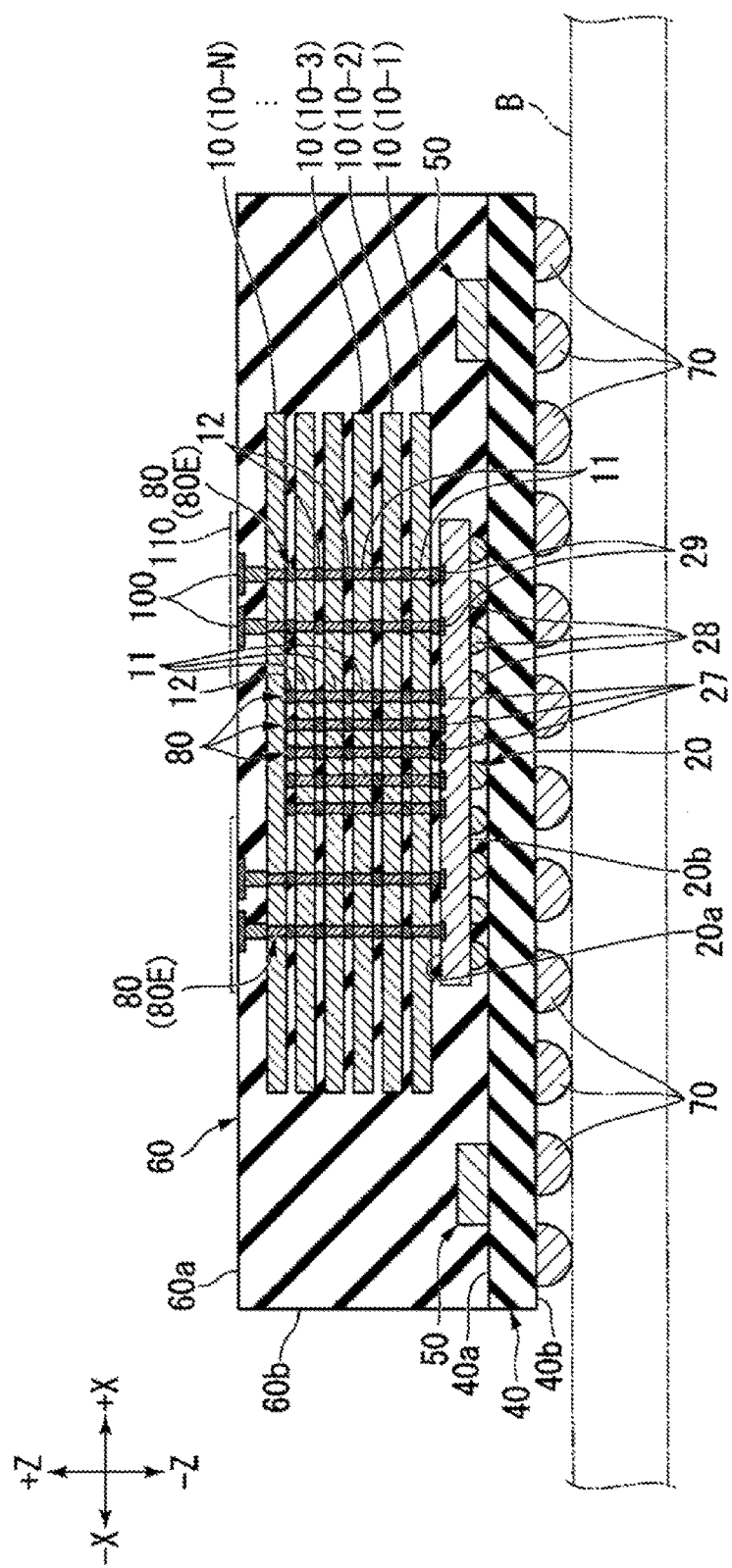
FIG. 8 is a cross-sectional view illustrating one or more embodiments of a semiconductor package according to a third aspect.

FIG. 8 is a cross-sectional view illustrating one or more embodiments of the semiconductor package 1 according to the present aspect. In the present aspect, the controller chip 20 includes the test terminals 29. The "test terminals" are terminals to which a signal for inspection is input or output in order to confirm whether the controller chip 20 is functioning as desired. The test terminals 29 are provided on, for example, the first surface 20a of the controller chip 20.

In the present aspect, the semiconductor package 1 includes a plurality of test pads 100. Specifically, the sealing resin portion 60 has a main surface 60a and a peripheral surface 60b. The main surface 60a faces the side opposite to the package board 40. The peripheral surface 60b extends between the edge of the main surface 60a and the package board 40. The plurality of test pads 100 are provided on the main surface 60a of the sealing resin portion 60. The test pads 100 are covered with an insulating cover 110 (e.g., a seal or a label) detachably attached to, for example, the main surface 60a. When the cover 110 is detached from the sealing resin portion 60, the test pads 100 are exposed to the outside of the sealing resin portion 60 (e.g., the outside of the semiconductor package 1).

In the present aspect, the plurality of through vias 80 include through vias 80E for the test terminals. Each through via 80E is an example of a "third through via." The through vias 80E penetrate the NAND chips 10 in the directionZ(e.g. all the NAND chips 10) to be physically and electrically connected to the test pads 100 and the test terminals 29 of the controller chip 20, respectively. Thus, the test pads 100 are electrically connected to the test terminals 29 of the controller chip 20 via the through vias 80E. As a result, when the controller chip 20 needs to be inspected, the inspector can inspect the controller chip 20 from the outside of the semiconductor package 1 by using the test pads 100.

According to this configuration, as in the first aspect, the semiconductor package 1 can be made small. Here, in a case where the memory package including the plurality of NAND chips and the controller chip 20 are separately mounted on the circuit board B, when failure occurs in the operation of the controller chip 20, the controller chip 20 can be detached from the circuit board B and relatively readily inspected. Meanwhile, in a case where the plurality of NAND chips 10 and the controller chip 20 are mounted in one package, it can be difficult to inspect the controller chip 20 since the controller chip 20 is sealed with the plurality of NAND chips 10 in an integrated manner by the sealing resin portion 60.

However, in the present aspect, the controller chip 20 includes the test terminals 29. At least one through via 80 includes a through via 80E connected to a test terminal 29 of the controller chip 20. According to this configuration, even when the plurality of NAND chips 10 and the controller chip 20 are mounted in one package, a signal is transmitted to or received from the test terminals 29 of the controller chip 20 via the through vias 80E. Thus, even when the controller chip 20 is sealed with the plurality of NAND chips 10 in an integrated manner by the sealing resin portion 60, the controller chip 20 can be readily inspected.

(Fourth Aspect)

Next, a semiconductor package 1 of a fourth aspect will be described. The present aspect is different from the third aspect in that in the present aspect, the test pads 100 are electrically connected to the test terminals 29 of the controller chip 20 via the package board 40. Meanwhile, configurations other than the configurations described below are substantially identical to those of the third aspect.

Figure 9:
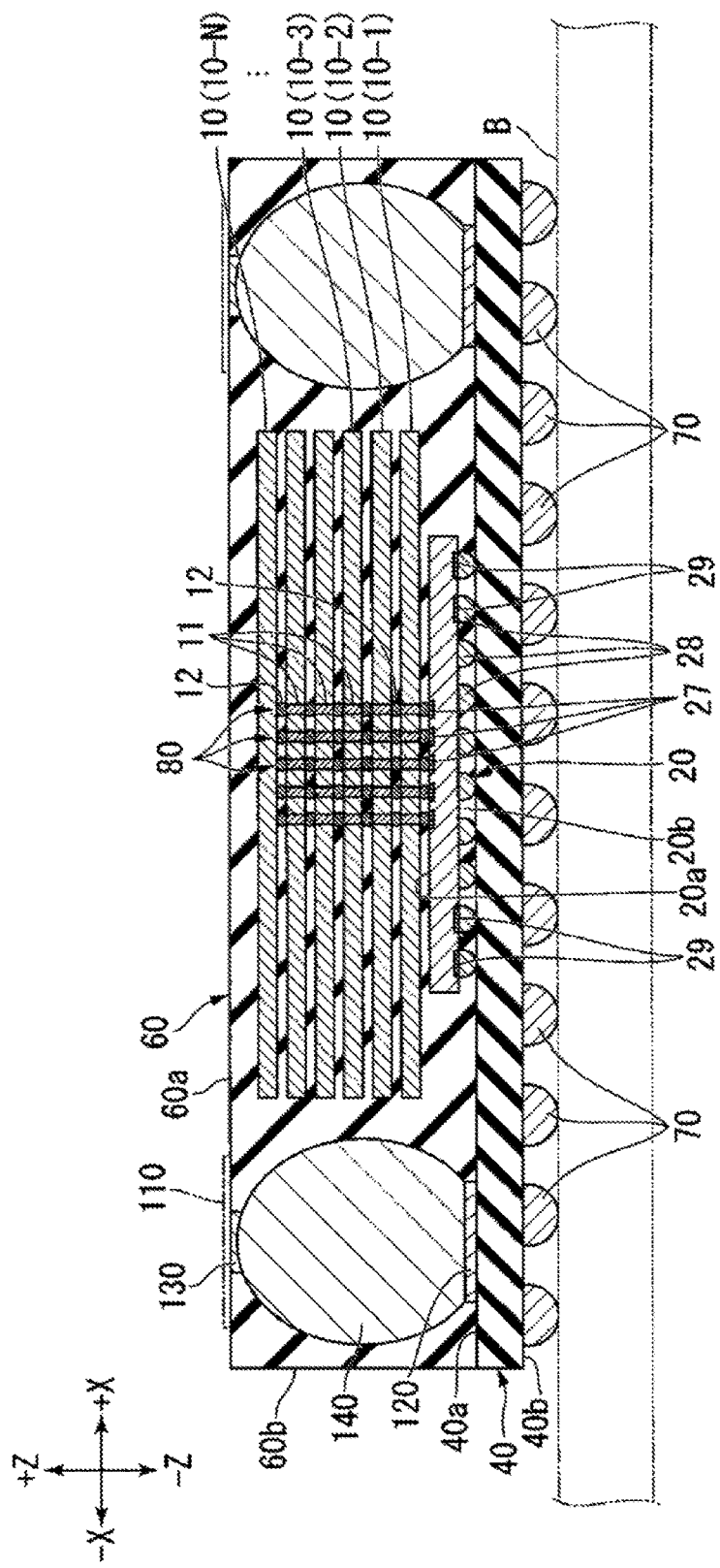
FIG. 9 is a cross-sectional view illustrating one or more embodiments of a semiconductor package according to a fourth aspect.

FIG. 9 is a cross-sectional view illustrating the semiconductor package 1 of the present aspect. In the present aspect, the test terminals 29 of the controller chip 20 are electrically connected to the package board 40 via the bumps 28 of the controller chip 20.

In the present aspect, the semiconductor package 1 includes a pad 120, a test terminal 130, and a connection electrode 140. The pad 120 is provided on the first surface 40a of the package board 40. The pad 120 is electrically connected to the test terminals 29 of the controller chip 20 via a wiring layer of the package board 40 and the bumps 28 of the controller chip 20. The test terminal 130 of the semiconductor package 1 is provided on the main surface 60a of the sealing resin portion 60. The test terminal 130 is covered with an insulating cover 110 detachably attached to, for example, the main surface 60a. When the cover 110 is detached from the sealing resin portion 60, the test terminal 130 is exposed to the outside of the sealing resin portion 60 (e.g., the outside of the semiconductor package 1). The connection electrode 140 is provided between the pad 120 and the test terminal 130 to electrically interconnect the pad 120 and the test terminal 130. In the present aspect, the connection electrode 140 is a relatively large solder ball. For example, the tip of the connection electrode 140 is located closer to the main surface 60a of the sealing resin portion 60 than the uppermost NAND chip 10-N. However, the connection electrode 140 is not limited to the example described above.

According to this configuration, as in the first aspect, the semiconductor package 1 can be made small. Further, according to the present aspect, as in the third aspect, even when the plurality of NAND chips 10 and the controller chip 20 are mounted in one package, the controller chip 20 can be readily inspected. That is, when the controller chip 20 needs to be inspected, the inspector can inspect the controller chip 20 from the outside of the semiconductor package 1 by using the test terminal 130.

(First Modification of Fourth Aspect)

Figure 10:
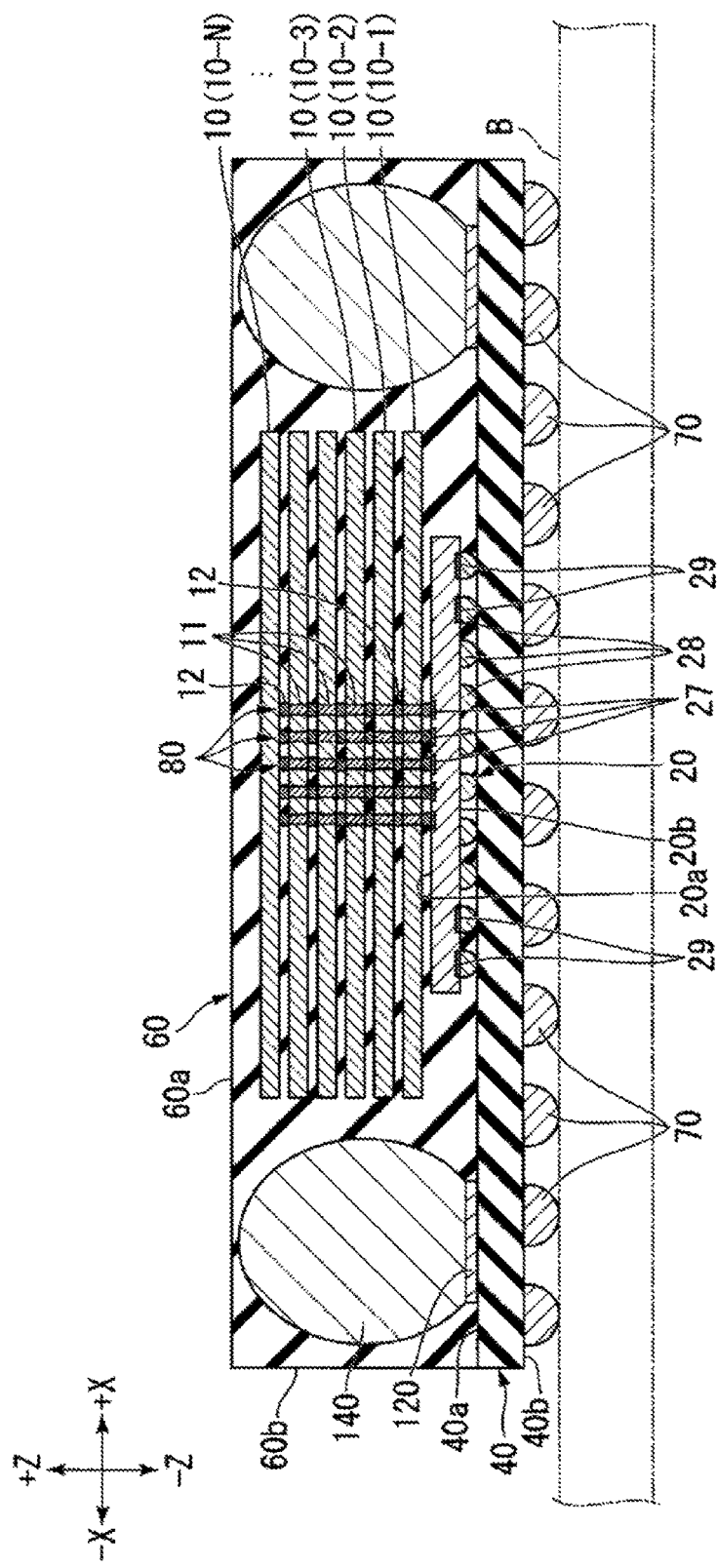
FIG. 10 is a cross-sectional view illustrating one or more embodiments of a semiconductor package according to a first modification of the fourth aspect.

FIG. 10 is a cross-sectional view illustrating a semiconductor package 1 of a first modification of the fourth aspect. Meanwhile, configurations other than the configurations described below are substantially identical to those of the fourth aspect. In the present modification, the test terminal 130 of the fourth aspect is omitted. In the present modification, when the controller chip 20 needs to be inspected, a hole is made in the sealing resin portion 60 by a laser processing or the like, or a portion of the sealing resin portion 60 is scraped and removed so that the portion of the connection electrode 140 is exposed to the outside of the sealing resin portion 60. The portion of the connection electrode 140 which is exposed to the outside of the sealing resin portion 60 can replace the test terminal 130 from a functional perspective. According to this configuration as well, as in the fourth aspect, it is possible to provide the semiconductor package 1 in which the controller chip 20 can be readily inspected.

(Second Modification of Fourth Aspect)

Figure 11:
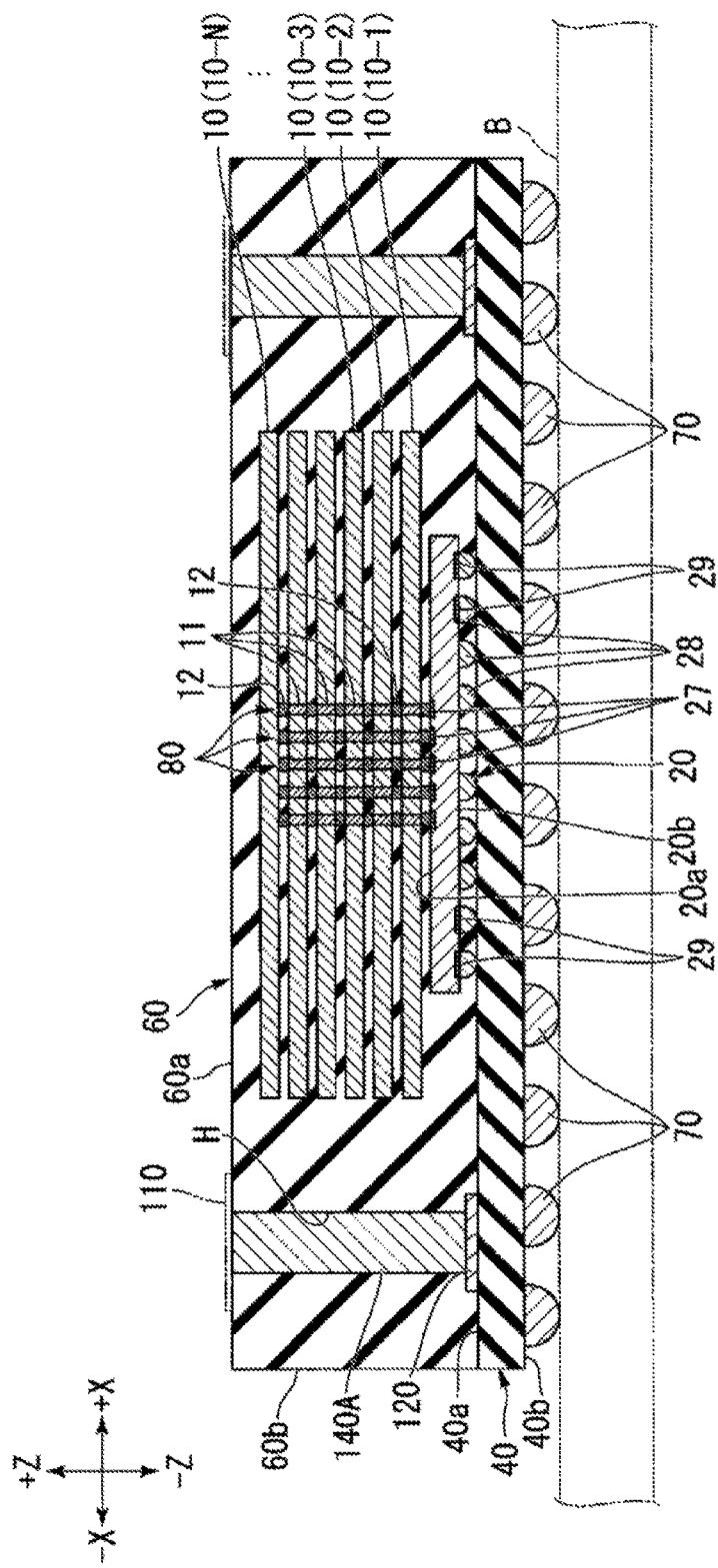
FIG. 11 is a cross-sectional view illustrating one or more embodiments of a semiconductor package according to a second modification of the fourth aspect.

FIG. 11 is a cross-sectional view illustrating a semiconductor package 1 according to a second modification of the fourth aspect. Meanwhile, configurations other than the configurations described below are substantially identical to those of the fourth aspect. In the present modification, instead of the connection electrode 140 made of a solder ball, a columnar connection electrode 140A is provided. The connection electrode 140A is formed by forming a hole H in the sealing resin portion 60 by a laser processing or the like and providing a conductive material inside or on the internal surface of the hole H. According to this configuration, as in the fourth aspect, it is possible to provide the semiconductor package 1 in which the controller chip 20 can be readily inspected.

(Fifth Aspect)

Next, a semiconductor package 1 of a fifth aspect will be described. The present aspect is different from the first aspect in that, in the present aspect, the controller chip 20 is disposed on a side of the plurality of NAND chips 10 opposite to the package board 40. Meanwhile, configurations other than the configurations described below are substantially identical to those of the first aspect.

Figure 12:
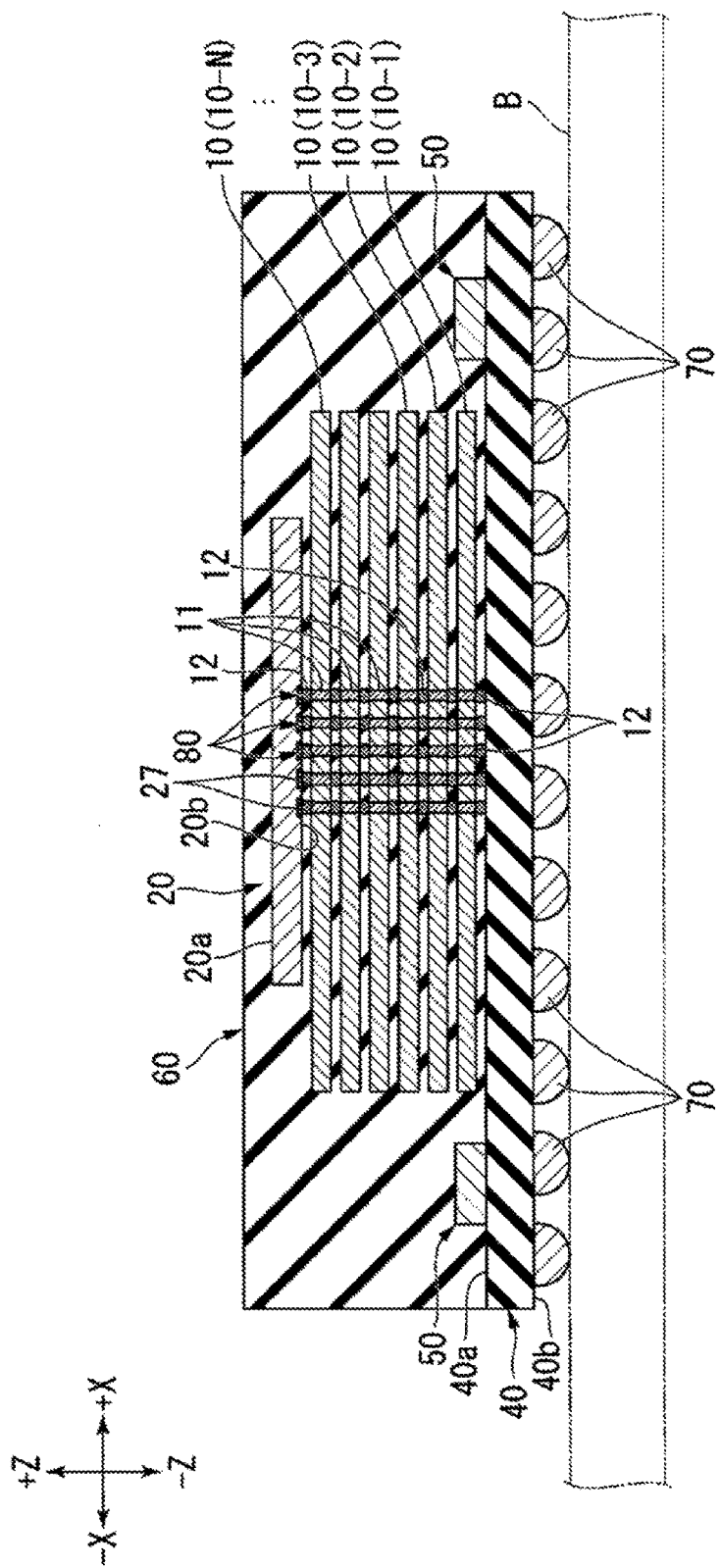
FIG. 12 is a cross-sectional view illustrating one or more embodiments of a semiconductor package according to a fifth aspect.

FIG. 12 is a cross-sectional view illustrating a semiconductor package 1 of the present aspect. In the present aspect, the controller chip 20 is located on a side of the plurality of NAND chips 10 opposite to the package board 40 with respect to the plurality of NAND chips 10 (e.g. is disposed on a top NAND chip 10 in the direction). In the present aspect, the lowermost NAND chip 10-1 in the Z direction among the plurality of NAND chips 10 includes a plurality of connection electrodes 12 bonded to a plurality of pads (not illustrated) provided on the first surface 40a of the package board 40.

In the present aspect, the through vias 80 include connection electrodes 12 provided between the controller chip 20 and the uppermost NAND chip 10-N, through vias 11 of the plurality of NAND chips 10, connection electrodes 12 provided among the plurality of NAND chips 10, and connection electrodes 12 provided between the lowermost NAND chip 10-1 and the package board 40. The through vias 80 penetrate the plurality of NAND chips 10 along the direction Z to be physically and electrically connected to the terminals 27 of the controller chip 20. The controller chip 20 is electrically connected to the plurality of NAND chips 10 via the plurality of through vias 80. Further, the controller chip 20 is electrically connected to the package board 40 via the plurality of through vias 80.

According to this configuration, the same or similar effect as that of the semiconductor package 1 of the first aspect can be obtained. In addition, the configuration of the present aspect can be applied in combination with any of the above-described aspects and modifications.

(Sixth Aspect)

Next, one or more embodiments of a semiconductor package 1 according to a sixth aspect will be described. The sixth aspect is different from the fourth aspect in that in the sixth aspect, the controller chip 20 and the plurality of NAND chips 10 are separately mounted on the package board 40 (e.g. are not stacked). Meanwhile, configurations other than the configurations described below are substantially identical to those of the fourth aspect. In addition, the sixth aspect can be applied in combination with the first and second modifications of the fourth aspect.

Figure 13:
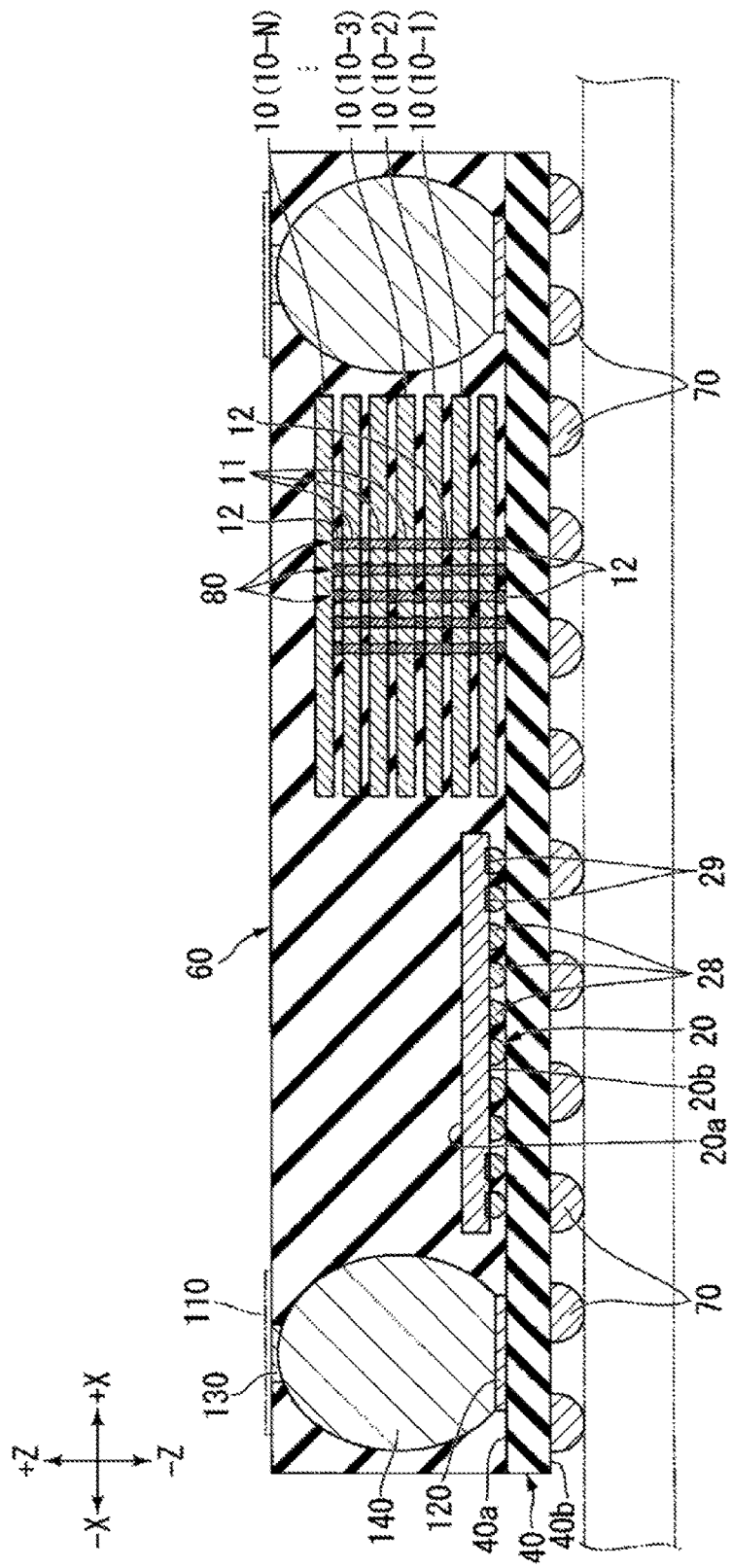
FIG. 13 is a cross-sectional view illustrating one or more embodiments of a semiconductor package according to a sixth aspect.

FIG. 13 is a cross-sectional view illustrating one or more embodiments of a semiconductor package 1 according to the sixth aspect. In the sixth aspect, the controller chip is disposed at a position different from that of the plurality of NAND chips 10 in the direction X. Accordingly, the controller chip 20 and the plurality of NAND chips 10 are separately mounted on the package board 40. As in the fourth aspect, the semiconductor package 1 includes the pad 120, the test terminal 130, and the connection electrode 140.

In the sixth aspect, the controller chip 20 may be electrically connected to the package board 40 by bonding wires, instead of being flip-chip mounted on the package board 40. In addition, the plurality of NAND chips 10 may be electrically connected to the package board 40 by bonding wires, instead of via the through vias 80.

According to this configuration, as in the fourth aspect, it is possible to provide the semiconductor package 1 in which the controller chip 20 can be readily inspected even when the plurality of NAND chips 10 and the controller chip 20 are mounted in one package.

Several embodiments, aspects, and modifications thereof have been described herein. However, the present disclosure is not limited to the examples described above. For example, the semiconductor package 1 may be a ball grid array (BGA) type package or a land grid array (LGA) type package.

In at least one of the example embodiments described above, the plurality of semiconductor memory chips have at least one through via that penetrates one or more semiconductor memory chips to be connected to the controller chip. According to this configuration, it is possible to provide a small semiconductor package.

While certain embodiments have been described, these embodiments have been presented byway of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor package comprising:
   a board;
   a plurality of semiconductor memory chips stacked in a thickness direction of the board;
   a controller chip disposed between the board and the plurality of semiconductor memory chips or on a side of the plurality of semiconductor chips opposite to the board; and
   a sealing resin portion that seals the plurality of semiconductor memory chips and the controller chip,
   wherein the plurality of semiconductor memory chips include at least one through via that penetrates one or more semiconductor memory chips included in the plurality of semiconductor memory chips in the thickness direction of the board to be connected to the controller chip, and
   the controller chip includes a first region and a second region where an amount of heat generated per unit area is larger than that generated in the first region, the at least one through via includes a plurality of through vias of a first group that are connected to the first region, and a plurality of through vias of a second group that are connected to the second region, and an arrangement density of the plurality of through vias of the second group is higher than an arrangement density of the plurality of through vias of the first group.

2. The semiconductor package according to claim 1, wherein the plurality of semiconductor memory chips include a first semiconductor memory chip, the at least one through via includes a first through via electrically connected to the first semiconductor memory chip, and the controller chip communicates with the first semiconductor memory chip via the first through via.

3. The semiconductor package according to claim 1, further comprising:
   an electronic component mounted on the board, sealed by the sealing resin portion, and electrically connected to the controller chip,
   wherein, in a direction substantially orthogonal to the thickness direction of the board, a shortest distance between the electronic component and at least one semiconductor memory chip of the plurality of semiconductor memory chips is shorter than a shortest distance between the electronic component and an edge of the board.

4. The semiconductor package according to claim 1, wherein the controller chip is disposed between the board and the plurality of semiconductor memory chips, the at least one through via includes a first through via electrically connected to the one or more semiconductor memory chips included in the plurality of semiconductor memory chips, and the controller chip is flip-chip mounted on the board.

5. The semiconductor package according to claim 1, wherein a through via of the plurality of through vias of the second group is electrically connected to a ground of the controller chip.

6. The semiconductor package according to claim 5, further comprising:
   a heat radiation plate disposed on a side of the plurality of semiconductor memory chips opposite to the controller chip, and
   wherein a through via of the plurality of through vias of the second group penetrates the plurality of semiconductor chips to be connected to the heat radiation plate.

7. The semiconductor package according to claim 6, wherein at least a portion of the heat radiation plate is exposed to an outside of the sealing resin portion.

8. The semiconductor package according to claim 4, wherein the controller chip includes a processor that controls writing of data for at least one semiconductor memory chip included in the plurality of semiconductor memory chips by executing a program, and the at least one through via includes a through via connected to a region of the controller chip which overlaps with the processor in the thickness direction of the board.

9. The semiconductor package according to claim 4, wherein the controller chip includes a circuitry that controls writing of data for at least one semiconductor memory chip of the plurality of semiconductor memory chips, and the at least one through via includes a through via connected to a region of the controller chip which overlaps with the circuitry in the thickness direction of the board.

10. The semiconductor package according to claim 4, wherein the controller chip includes a test terminal, and the at least one through via includes a through via connected to the test terminal of the controller chip.

11. The semiconductor package according to claim 10, further comprising:
    a pad provided on a surface of the sealing resin portion,
    wherein the through via connected to the test terminal of the controller chip penetrates the plurality of semiconductor memory chips to be electrically connected to the pad.

12. The semiconductor package according to claim 4, further comprising:
    a pad provided on a surface of the sealing resin portion,
    wherein the at least one through via includes a through via that penetrates the plurality of semiconductor memory chips to be electrically connected to the pad.

13. The semiconductor package according to claim 1, wherein the arrangement density of the plurality of through vias of the second group is higher than the arrangement density of the plurality of through vias of the first group by a ratio of 1.1 or more.

* * * * *